(12) United States Patent
Lu et al.

(10) Patent No.: US 9,184,153 B2
(45) Date of Patent: Nov. 10, 2015

(54) CHIP STACK STRUCTURE AND METHOD FOR FABRICATING THE SAME

(75) Inventors: Su-Tsai Lu, Hsinchu (TW); Jing-Ye Juang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 368 days.

(21) Appl. No.: 13/467,054

(22) Filed: May 9, 2012

(65) Prior Publication Data
US 2013/0234320 A1 Sep. 12, 2013

(30) Foreign Application Priority Data
Mar. 9, 2012 (TW) .............................. 101108151 A

(51) Int. Cl.
| H01L 23/48 | (2006.01) |
| H01L 23/52 | (2006.01) |
| H01L 29/40 | (2006.01) |
| H01L 23/00 | (2006.01) |
| H01L 25/065 | (2006.01) |
| H01L 25/00 | (2006.01) |

(52) U.S. Cl.
CPC ............ *H01L 24/94* (2013.01); *H01L 24/96* (2013.01); *H01L 24/97* (2013.01); *H01L 25/0657* (2013.01); *H01L 25/50* (2013.01); H01L 2224/0401 (2013.01); H01L 2224/04105 (2013.01); H01L 2224/12105 (2013.01); H01L 2224/16145 (2013.01); H01L 2224/16225 (2013.01); H01L 2224/32145 (2013.01); H01L 2224/32225 (2013.01); H01L 2224/73204 (2013.01); H01L 2224/94 (2013.01); H01L 2224/97 (2013.01); H01L 2225/06513 (2013.01); H01L 2225/06517 (2013.01); H01L 2225/06541 (2013.01); H01L 2225/06565 (2013.01); H01L 2225/06568 (2013.01); H01L 2924/15311 (2013.01)

(58) Field of Classification Search
USPC ........................................................ 257/737
See application file for complete search history.

(56) References Cited

U.S. PATENT DOCUMENTS

| 6,841,883 B1 | 1/2005 | Farnworth et al. |
| 7,151,009 B2 | 12/2006 | Kim et al. |

(Continued)

FOREIGN PATENT DOCUMENTS

| CN | 1964038 | 5/2007 |
| TW | 200908280 | 2/2009 |

(Continued)

OTHER PUBLICATIONS

"Office Action of Taiwan Counterpart Application", issued on Apr. 7, 2014, p. 1-p. 8.

(Continued)

*Primary Examiner* — Marc Armand
*Assistant Examiner* — Wilner Jean Baptiste
(74) *Attorney, Agent, or Firm* — Jianq Chyun IP Office

(57) ABSTRACT

A chip stack structure taking a wafer as a stacking base and stacking chips thereon is provided. The chip stack structure is capable of achieving high density electrode bonding and breaking the bottleneck of requiring interposer to serve as a transferring interface in three dimensional chip package. The chip stack structure is easily fabricated and compatible with wafer level process, so as to reduce processing time and manufacturing cost. A method for fabricating the chip stack structure is also provided.

16 Claims, 6 Drawing Sheets

(56) References Cited

U.S. PATENT DOCUMENTS

| | | | |
|---|---|---|---|
| 7,183,494 B2 | 2/2007 | Lu et al. | |
| 7,576,433 B2 | 8/2009 | Ishino et al. | |
| 7,763,498 B2 | 7/2010 | Kim | |
| 7,977,156 B2 | 7/2011 | Lee et al. | |
| 2002/0056906 A1* | 5/2002 | Kajiwara et al. | 257/697 |
| 2005/0280160 A1* | 12/2005 | Kim et al. | 257/777 |
| 2007/0075435 A1 | 4/2007 | Suminoe et al. | |
| 2008/0308921 A1* | 12/2008 | Kim | 257/686 |
| 2009/0039492 A1 | 2/2009 | Kang et al. | |
| 2010/0044881 A1* | 2/2010 | Fujimoto | 257/777 |
| 2011/0045636 A1 | 2/2011 | Chung | |
| 2011/0051378 A1 | 3/2011 | Wang et al. | |
| 2011/0074017 A1 | 3/2011 | Morifuji et al. | |
| 2011/0237004 A1 | 9/2011 | Lee et al. | |
| 2011/0287582 A1* | 11/2011 | Shimada et al. | 438/107 |

FOREIGN PATENT DOCUMENTS

| | | |
|---|---|---|
| TW | 201027692 | 7/2010 |
| TW | I328272 | 8/2010 |
| TW | 201041116 | 11/2010 |
| TW | 201128761 | 8/2011 |
| TW | I348207 | 9/2011 |
| TW | 201209987 | 3/2012 |

OTHER PUBLICATIONS

Chun-Chih Chuang et al, "20um-Pitch Complaint—Bump—Bonded Chip-on-Flex by Pre-applied Wafer Level Adhesives", International Microsystems, Packaging, Assembly and Circuits Technology Conference, 2009, pp. 56-59.

K. Sakuma et al., "IMC Bonding for 3D Interconnection", 2010 Elecctronic Components and Technology Conference, 2010, pp. 864-871.

Chau-Jie Zhan et al, "Assembly and Reliability Characterization of 3D Chip Stacking with 30um Pitch Lead-Free Solder Micro Bump Interconnection", 2010 Electronic Components and Technology Conference, 2010, pp. 1043-1049.

Jing-Yao Chang et al., "High Throughput Chip on Wafer Assembly Technology and Metallurgical Reactions of Pb-free micro-joints within a 3DIC Package", ICEP 2010 Proceedings, 2010, pp. 159-164.

Rahul Agarwal et al., "Cu/Sn Microbumps Interconnect for 3D TSV Chip Stacking", 2010 Electronic Components and Technology Conference, 2010, pp. 858-863.

"Office Action of China Counterpart Application", issued on May 5, 2015, p. 1-p. 8.

* cited by examiner

CHIP STACK STRUCTURE AND METHOD FOR FABRICATING THE SAME

CROSS-REFERENCE TO RELATED APPLICATION

This application claims the priority benefit of Taiwan application serial no. 101108151, filed Mar. 9, 2012. The entirety of the above-mentioned patent application is hereby incorporated by reference herein and made a part of this specification.

TECHNICAL FIELD

The disclosure relates to a chip stack technology.

BACKGROUND

With advancement of information technology, electronic product designs reveal a trend of light weight, thinness and compactness. Three dimensional integration techniques promote high density chip package in high efficiency and low power consumption. For instance, to the portable electronic devices with the characteristic of multi-function or small size, such as solid state drives (SSD) or DRAMs, processing performance thereof can be improved, and power consumption of chips during operation can be reduced without altering I/O terminals, so as to satisfy the demand of high capacity, high efficiency, and high density of I/O terminals.

The three dimensional chip integration techniques include the fabrication of through silicon via (TSV) and micro bumps, and steps of wafer thinning, alignment, bonding and dispensing. However, the existing bonding process, such as the chip-to-wafer (COW) bonding process, still suffers from some outstanding bottlenecks. For example, the high temperature of bonding process may cause high residual stress. Small scribe line in high density chip package is unfavorable for performing dispensing process. In addition, a molding process is conducted to a chip stack module following the dispensing process. However, after the molding process, since the chip stack module is provided by stacking a chip to a wafer temporarily attached to a carrier via an adhesive, part of the adhesive may not be completely removed and remain on bumps at the bottom of the wafer when debonding the wafer from the carrier, which affects processing yields. Furthermore, the bonding interface between the chip stack module and an external interposer or circuit substrate is fragile and affects the reliability of products.

SUMMARY

The chip stack structure includes a first chip, at least one second chip, an adhesive and an encapsulant. The first chip has a first surface and a plurality of first contacts on the first surface. The at least one second chip is stacked on the first surface, wherein each of the at least one second chip has a second surface facing the first surface, a third surface opposite to the first chip, and a plurality of side surfaces connected between the second surface and the third surface. Each of the at least one second chip comprises a plurality of first bumps on the second surface, a plurality of second bumps on the third surface, and a plurality of first penetrating electrodes connected between the corresponding first bumps and second bumps, wherein each of the first bumps is bonded to the corresponding first contact or the corresponding second bump of another second chip. The adhesive is disposed in a space between any two adjacent chips of the first chip and the at least one second chip with voiding a part of the space, wherein the adhesive is configured to cover each of the first bumps and the corresponding first contact or the corresponding second bump. The encapsulant is disposed on the first surface to cover the adhesive and the side surfaces of each of the at least one second chip, wherein the voided space between the any two adjacent chips is filled with the encapsulant.

A method of fabricating the aforementioned chip stack structure is provided. A wafer having a first surface and a plurality of first contacts on the first surface is provided. In addition, plural second chips are provided, each of the second chips has a second surface, a third surface opposite to the second surface and a plurality of side surfaces connected between the second surface and the third surface, each of the second chips comprises a plurality of first bumps disposed on the second surface, a plurality of second bumps disposed on the third surface, and a plurality of first penetrating electrodes respectively connected between the corresponding first bumps and the corresponding second bumps. Then, a first adhesive is provided to the first surface of the wafer or the second surface of each of the second chips. And, the second chips are bonded to the wafer, wherein the second surface of each of the second chips faces the wafer, and the first bumps are respectively connected to the corresponding first contacts. The first adhesive covers each of the first bumps and the corresponding first contact with voiding a part of a space between each of the second chips and the wafer. Next, an encapsulant is provided on the first surface to cover the first adhesive and the side surfaces of each of the plurality of second chips, wherein the voided space between each of the second chips and the wafer is filled with the encapsulant. Then, the encapsulant and the wafer are trimmed, and the wafer is separated into a plurality of first chips.

In order to make the aforementioned and other objects, features and advantages of the disclosure more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
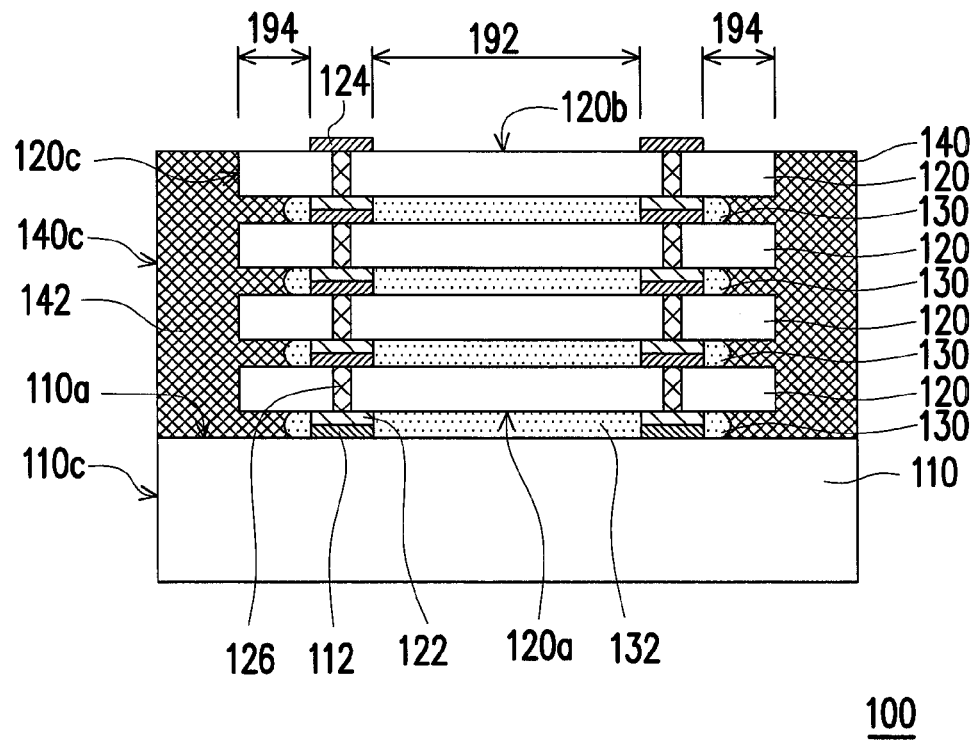
FIG. 1A illustrates a chip stack structure according to an embodiment of the disclosure.

FIG. 1A illustrates a chip stack structure according to an embodiment of the disclosure. The chip stack structure 100 of the embodiment is formed by performing a chip stacking process on a wafer, and comprises a first chip 110 serving as a stacking base, one or more second chips 120 stacked on the first chip 110, wherein a thickness of the first chip 110 is greater than 100 μm for providing a good supporting effect in the chip stacking process. In addition, a size of the first chip 110 may be greater than a size of the second chip 120, wherein the size refers to thickness, length, width, or area of a chip.

The embodiment shows stacking plural second chips 120 on the first chip 110, while the number of the second chips 120 may be varied according to actual situations and is not limited by the embodiment. A detailed illustration to the chip stack structure is provided hereinafter.

The first chip 110 has a first surface 110a and a plurality of first contacts 112 on the first surface 110a. Herein, the first contacts 112 may be metallic pads or solder bumps on the metallic pads. Each of the second chips 120 has a second surface 120a, a third surface 120b opposite to the second surface 120a, and a plurality of side surfaces 120c connected between the second surface 120a and the third surface 120b. Each of the second chips 120 is also provided with a plurality of first bumps 122 on the second surface 120a, a plurality of second bumps 124 on the third surface 120b, and a plurality of first penetrating electrodes 126 connected between the corresponding first bumps 122 and the corresponding second bumps 124.

Figure 1B:
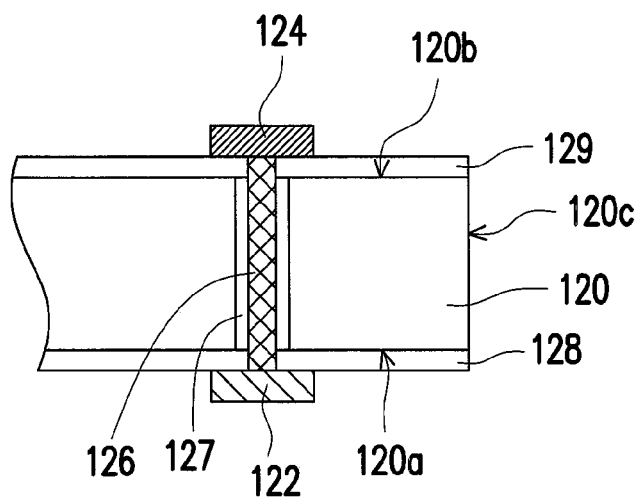
FIG. 1B is a partially enlarged view of the first penetrating electrode in FIG. 1A.

Furthermore, the first penetrating electrodes 126 as show in FIG. 1A are, for example, through silicon vias (TSVs) to provide a vertical conducting path passing through the second chip 120 and between the first bumps 122 and the second bumps 124. FIG. 1B is a partially enlarged view of the first penetrating electrode 126, wherein the first penetrating electrode 126 is surrounded by an penetrating electrode insulating layer 127, and a first insulating layer 128 and a second insulating layer 129 are respectively formed on the second surface 120a and the third surface 120b of the second chip 120. The penetrating insulating layer 127 is connected to the first insulating layer 128 and the second insulating layer 129. Material of the penetrating insulating layer 127, the first insulating layer 128 and the second insulating layer 129 may be silicon oxide ($SiO_2$) or polymer such as polyimide (PI). Each of the first penetrating electrodes 126 passes through the first insulating layer 128 and the second insulating layer 129 to connect the corresponding first bump 122 and the corresponding second bump 124. The penetrating insulating layer 127 may further be omitted in another embodiment, wherein an insulating gap or space can be formed between the first penetrating electrode 126 and the second chip 120.

Referring to FIG. 1A, the second chip 120 are stacked on the first surface 110a of the first chip 110 in sequence by facing the second surface 120a to the first chip 110.

The first bumps 122 on the second surface 120a of a second chip 120 are bonded to the first contacts 112 of the first chip 110 or the second bumps 124 of another second chip 120 correspondingly. Accordingly, the stacked first chip 110 and second chips 120 can be conducted with one another through the first contacts 112, the first bumps 122, the second bumps 124 and the first penetrating electrodes 126. Herein, the first bumps 122 and the second bumps 124 can be fabricated by electroplating or chemical deposition, while the material of the first bumps 122 and the second bumps 124 may comprise an electroplating metal or an electroless plating metal.

In addition, an adhesive 130 can be provided between the adjacent first chip 110 and second chip 120, or two adjacent second chips 120, wherein the adhesive 130 in a paste type or a film type encapsulates each of the first bump 122 and the corresponding first contact 112 or the corresponding second bump 124 of another second chip 120, to ensure a bonding effect there between. Furthermore, the chip stack structure 100 further includes an encapsulant 140, disposed on the first surface 110a of the first chip 110, to cover the adhesive 130 and the side surfaces 120c of each of the second chip 120, for protecting the chip stack structure 100, and preventing external moisture or impurities from entering the chip stack structure 100 and affecting the operation of devices. The third surface 120b of the uppermost second chip 120 in FIG. 1A is exposed by the encapsulant 140, and thus the chip stack structure 100 can be electrically connected to external devices through the second bumps 124 on the exposed third surface 120b. The chip stack structure 100 of the embodiment can be formed by a wafer level process, wherein the first chip 110 of a wafer serves as a stacking base, on which one or more second chips 120 are stacked, and then a trimming process is conducted after the encapsulant 140 is formed. After the trimming process, the side surfaces 140c of the encapsulant 140 are respectively aligned with the side surfaces 110c of the first chip 110.

In the embodiment, the adhesive 130 does not fill the entire space between two adjacent first chips 110 or 120, while the voided space is then filled with the encapsulant 140 in following steps. In other words, the adhesive 130 is used to protect the bonding structure between the first contacts and the corresponding first bumps 122 or between the first bumps 122 and the corresponding second bumps 124, and thus the adhesive 130 can be selectively disposed on the aforementioned positions rather than the entire surface of the first chip 110 or the second chips 120. On the other hand, in consideration of the material of the adhesive 130 and the encapsulant 140, quantity of the adhesive 130 with higher cost can be reduced, to lower the manufacturing cost.

The adhesive 130 is provided into the space between the bonding structures of the first contacts 112 of the first chip 110 and the first bumps 122 of the second chip 120, and provided into the space between the bonding structures of the first bumps 122 and the second bumps 124 of two adjacent second chips 120. In other words, the adhesive 130 encapsulates the bonding structures between the first contacts 112 and the first bumps 122 and between the first bumps 122 and the second bumps 124, wherein a center region 192 of the space surrounded by the bonding structures is fully filled with the adhesive 130, and a peripheral region 194 of the space outside the bonding structures is partially filled with the adhesive 130. Then, the voided space between the first chip 110 and the second chip 120 or between two adjacent second chips 120 is filled with the encapsulant 140, i.e., the peripheral region 194 of the space outside the bonding structures.

Figure 2:
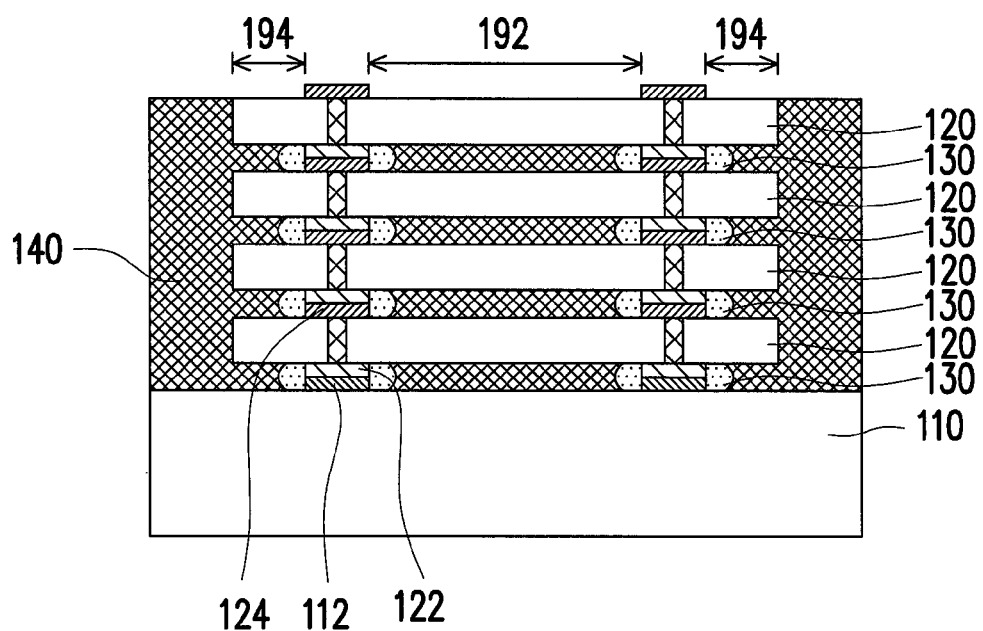
FIG. 2 illustrates a chip stack structure according to another embodiment of the disclosure.

In another embodiment as shown in FIG. 2, the adhesive 130 can be dispensed on the first contacts 112 of the first chip 110 or the first bumps 122 and the second bumps 124 of the second chips 120, and thereby the center region 192 of the space surrounded by the bonding structures and the peripheral region 194 of the space outside the bonding structures are both voided. And then, the voided space of the center region 192 and the peripheral region 194 can be filled with the encapsulant 140 by conducting a molding process in vacuum.

Furthermore, the interfaces between the first and second bumps 122, 124 or the first contacts 112 are much sensitive to the problems induced by stress concentration, and may be damaged by the stress and become failure. Thus, in consideration of the material of the adhesive 130 and the encapsulant 140, match of coefficients of thermal expansion or strength of material may be taken into account. For example, the particle size or concentration of filler in the adhesive 130 and the encapsulant 140 can be adjusted, wherein the filler may comprise silicon oxide (SiO$_2$), metal particles, or metal coated polymer particles. In the embodiment, a first filler 132 of the adhesive 130 has a particle size smaller than that of a second filler 142 of the encapsulant 140, or, a weight percentage of the first filler 132 of the adhesive 130 is smaller than that of the second filler 142 of the encapsulant 140. The adhesive 130 can be filled into the space between the adjacent first chip 110 and the second chip 120 and the space between two adjacent second chips 120 effectively because that the particle size of the first filler 132 is smaller than that of the second filler 142 of the encapsulant 140. In addition, the adhesive 130 provided with a smaller weight percentage is more resilient than the encapsulant 140, to disperse and absorb stress effect due to difference between coefficients of thermal expansion coefficients of the first and second bumps 122, 124 and the first contacts 112. Furthermore, the encapsulant 140 is provided with a higher weight percentage than that of the adhesive 130, to prevent the moisture from entering the chip stack structure 100, protect the chip stack structure 100 from external force, and provide a reliable protect effect.

Figure 3:
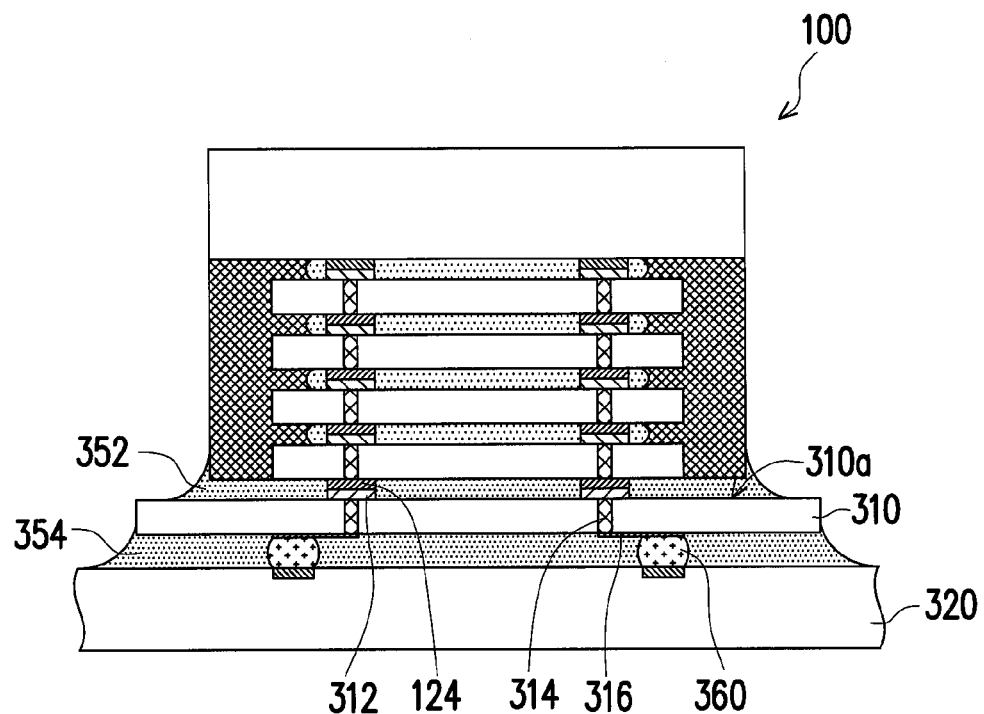
FIG. 3 illustrates a package structure formed by bonding the chip stack structure of FIG. 1 to a carrier.

FIG. 3 illustrates a package structure formed by bonding the chip stack structure 100 to a carrier. As shown in FIG. 3, the carrier 310 is for example an interposer serving as an adapting interface between the chip stack structure 100 and a printed circuit board. The carrier 310 is provided with a carrying surface 310a having a plurality of second contacts 312 thereon. In relative to FIG. 1A, the chip stack structure 100 in FIG. 3 is placed upside down and bonded to the carrier 310 by facing the first surface 110a of the first chip 110 to the carrier 310, wherein the second bumps 124 of the lowermost second chip 120 are correspondingly bonded to the second contacts 312. The second contacts 312 herein may be metallic pads or solder bumps on the metallic pads. Furthermore, being as an interposer, the carrier 310 may comprise a plurality of second penetrating electrodes 314 and redistribution circuits 316, wherein the second penetrating electrodes 314 are respectively connected to the corresponding second contacts 312 and the corresponding redistribution circuits 316 such that the chip stack structure 100 and the printed circuit board 320 can be bridged through the carrier 310. An underfill 352 is provided into a space between the chip stack structure 100 and the carrier 310, to encapsulate the second bumps 124 of the lowermost second chip 120 and the second contacts 312 of the carrier 310. The carrier 310 is connected to the printed circuit board 320 through a plurality of third bumps 360, and an underfill 354 is provided into a space between the carrier 310 and the printed circuit board 320, to encapsulate the third bumps 360.

Figure 4:
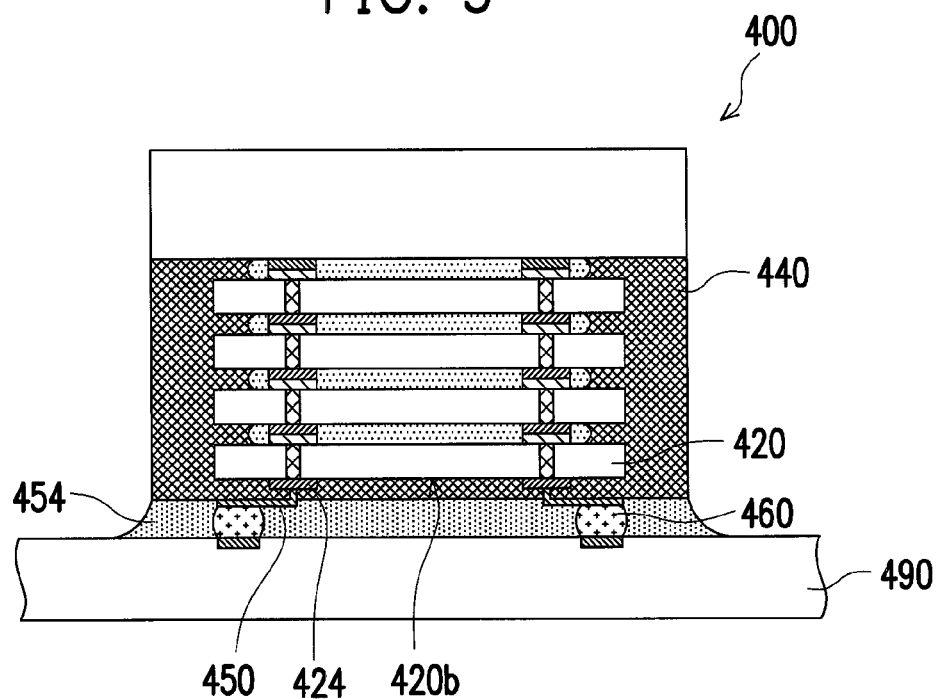
FIG. 4 illustrates a package structure formed by bonding a chip stack structure of another embodiment to a carrier.

FIG. 4 illustrates a package structure formed by bonding a chip stack structure 400 of another embodiment to a carrier. The chip stack structure 400 of the embodiment is similar to the chip stack structure 100 of FIG. 1A, except that: an encapsulant 440 covers a third surface 420b of the lowermost second chip 420 in FIG. 4, and the encapsulant 440 is provided with extending circuits 450 thereon, wherein the extending circuits 450 pass through the encapsulant 440 to connect the corresponding second bumps 424. The layout of the second bumps 424 can be redistributed by the extending circuit 450, such that the encapsulant 440 can be bonded to various carriers with different contact layouts. The carrier in FIG. 4 is a circuit substrate 490, such as a printed circuit board. In other words, the chip stack structure 400 of the embodiment can be bonded to the circuit substrate 490 without an interposer, wherein the extending circuit 450 can be connected to the circuit substrate 490 through a plurality of third bumps 460, and an underfill 454 is provided into a space between the chip stack structure 400 and the circuit substrate 490 to encapsulates the third bumps 460.

A fabrication method of a chip stack structure is further illustrated hereinafter. FIGS. 5A through 5D show a process of fabricating the chip stack structure 100 of the aforementioned embodiment. FIG. 6 is a top view of the structure in FIG. 5A. Herein, the same or similar elements are indicated by the same or similar reference numbers as shown in FIG. 1A, and the descriptions thereof are not repeated.

Figure 5A:
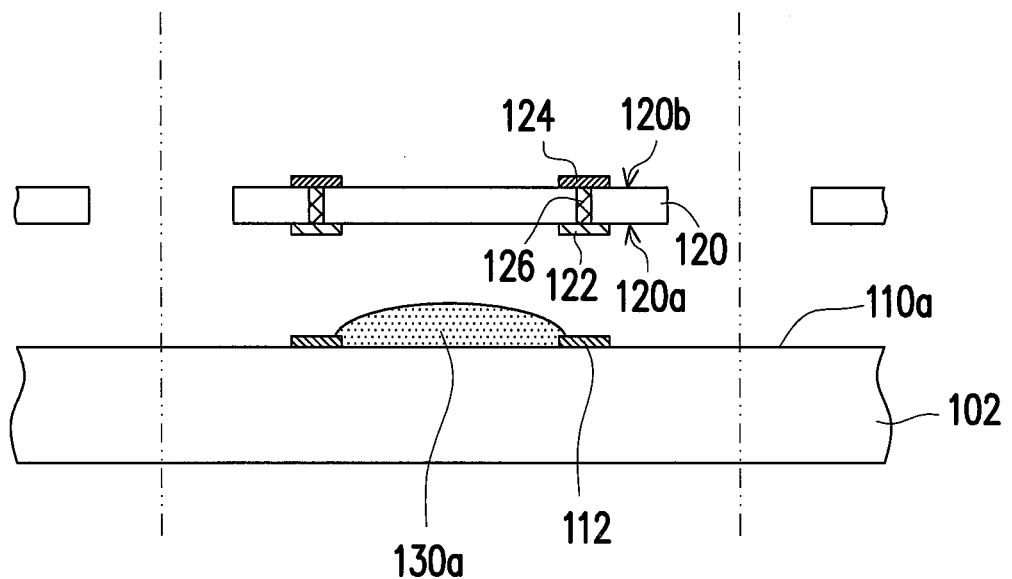
FIGS. 5A through 5D show a process of fabricating the chip stack structure according to an embodiment of the disclosure.
Figure 6:
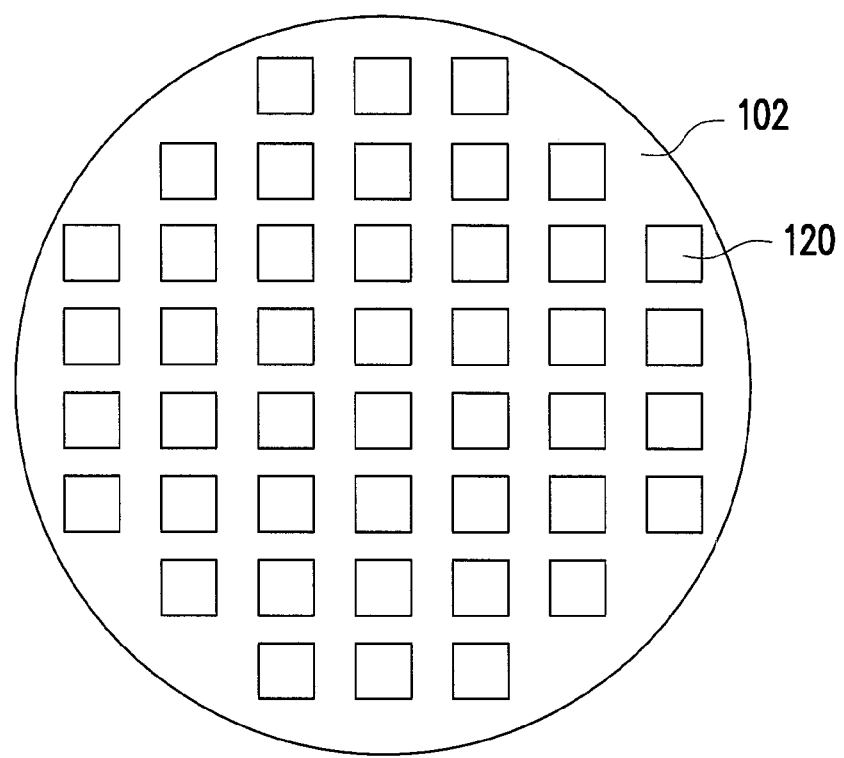
FIG. 6 is a top view of the structure in FIG. 5A.

First, referring to FIG. 5A and FIG. 6, a wafer 102 is provided to serve as a stacking base, wherein the wafer 102 can be trimmed into a plurality of first chips 110 as shown in FIG. 1A by a consequent trimming process. The wafer 102 is provided with a first surface 110a having a plurality of first contacts 112 thereon.

Plural second chips 120 to be stacked on the wafer 102 are provided. Each of the second chips 120 is provided with a plurality of first bumps 122 on the second surface 120a, a plurality of second bumps 124 on the third surface 120b, and a plurality of first penetrating electrodes 126 connected between the corresponding first bumps 122 and the corresponding second bumps 124. And, a first adhesive 130a is provided to the first surface 110a of the wafer 102 or the second surface 120a of each of the second chips 120, wherein the first adhesive 130a can be a paste type or a film type. Taking the paste type first adhesive 130a as an example, FIG. 5A shows the first adhesive 130a being disposed on the first surface 110a of the wafer 102.

Figure 5B:
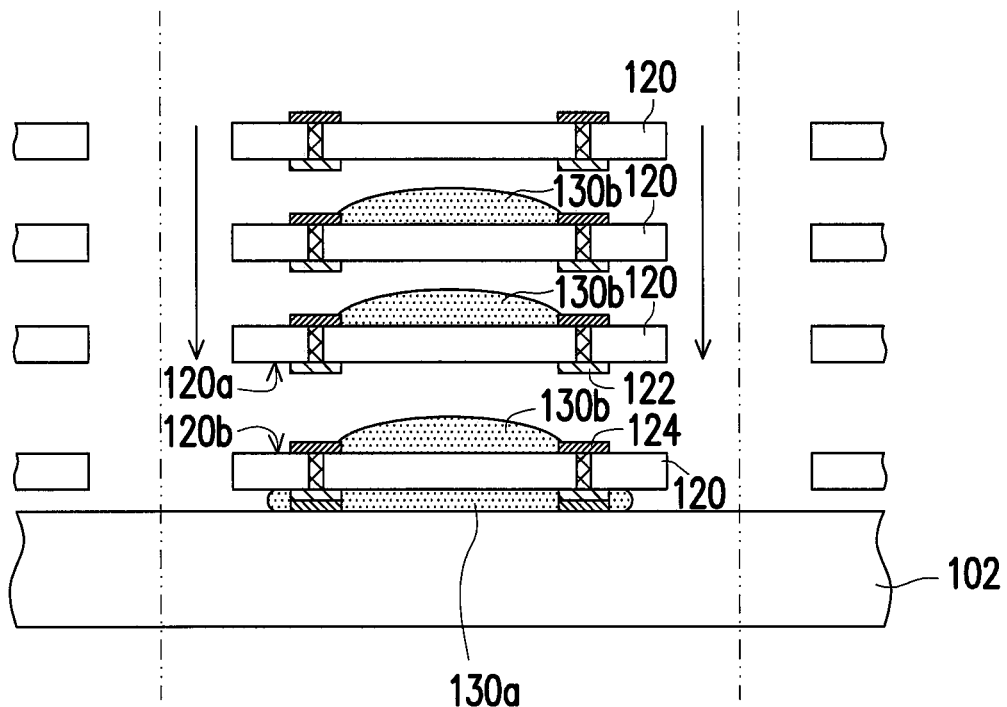

Then, as shown in FIG. 5B, the second chips 120 are bonded to the wafer 102, wherein the second surface 120a of each of the second chips 120 faces the wafer 102, and the first bumps 122 are respectively connected to the corresponding first contacts 112. Herein, a first thermal compressing process may be conducted for bonding the second chips 120 to the wafer 102. After bonding the second chips 120 to the wafer 102, the first adhesive 130a covers each of the first bumps 122 and the corresponding first contact 112 with voiding a part of a space between each of the second chips 120 and the wafer 102.

In addition, as shown in FIG. 5B, it is optional to continuously stack other second chips 120 on the previous second chips 120. Another batch of second chips 120 can be provided over the previous batch of second chips 120, wherein a second adhesive 130b can be provided to the second surface 120a of each of the another batch of second chips 120 or to the third surface 120b of each of the previous batch of second chips 120. Then, the another batch of second chips 120 is bonded to the previous batch of second chips 120 by performing a second thermal compressing process, wherein two stacked second chips 120 are connected via the corresponding first bumps 122 and the corresponding second bumps 124. In addition, the second adhesive 130b covers each of the first bumps 122 and the corresponding second bumps 124 with voiding a part of a space between the two stacked second chips 120. Accordingly, multi layers of second chips 120 stacked on the wafer 102 can be formed.

The aforementioned steps of forming the first adhesive 130a and the second adhesive 130b can be referred to FIG. 1A or FIG. 2. As shown in FIG. 1A, the center region 192 of the space surrounded by the bonding structures is fully filled with the first adhesive 130a and the second adhesive 130b, and a peripheral region 194 of the space outside the bonding structures is partially filled with the first adhesive 130a and the second adhesive 130b. Or, as shown in FIG. 2, the center region 192 of the space surrounded by the bonding structures is partially filled with the first adhesive 130a and the second adhesive 130b, and a peripheral region 194 of the space outside the bonding structures is partially filled with the first adhesive 130a and the second adhesive 130b.

Furthermore, a third thermal compressing process can be conducted after completing the stacking process of the second chips 120, so as to tightly bonding the second chips 120 with the wafer 102 and ensure the reliability of the bonding interfaces among the second chips 120 and the wafer 102. In other words, pre-compressing steps, such as the first thermal compressing process and the second thermal compressing process, with low temperature, short compressing time and low applying pressure can be conducted as stacking the individual second chip 120, and then a main compressing step with relative high temperature, long compressing time and large applying pressure is conducted to all of the second chips 120.

However, in another embodiment, the pre-compressing process and the main compressing process are not conducted. In other words, the first thermal compressing process and the second thermal compressing process are conducted in the conditions of the aforementioned main compressing step during individually stacking the second chips 120. Therefore, the third thermal compressing process to all of the second chips 120 as mentioned above can be omitted.

Figure 5C:
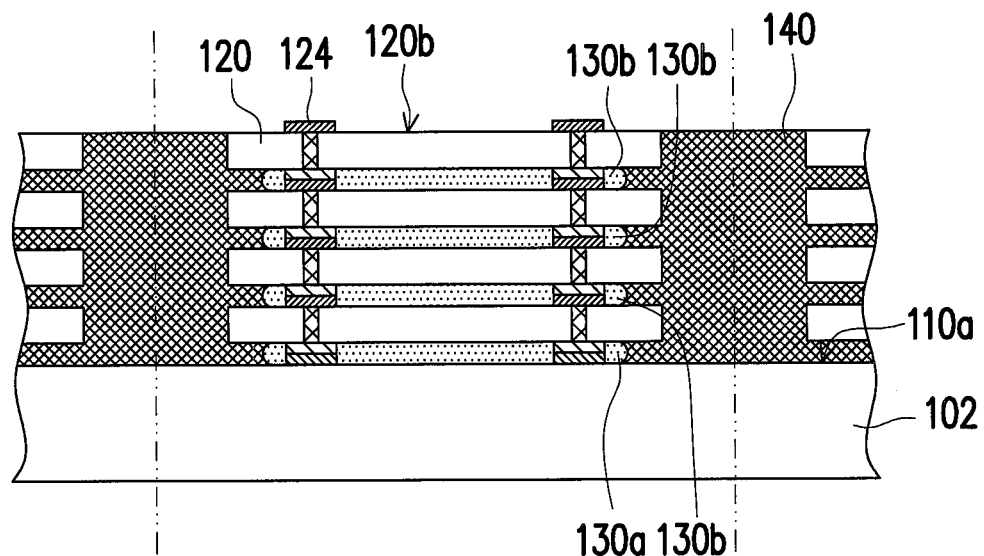

Then, after the stacking of the second chips 120, referring to FIG. 5C, an encapsulant 140 is provided on the first surface 110a of the wafer 102 to cover the first adhesive 130a, the second adhesive 130b, and the side surfaces 120c of each of the second chips 120, wherein the voided space between two stacked second chips 120 or between the second chip 120 and the wafer 102 is filled with the encapsulant 140. Herein, the third surface 120b of the uppermost second chip 120 and the second bumps 124 on the third surface 120b are exposed by the encapsulant 140.

Figure 5D:
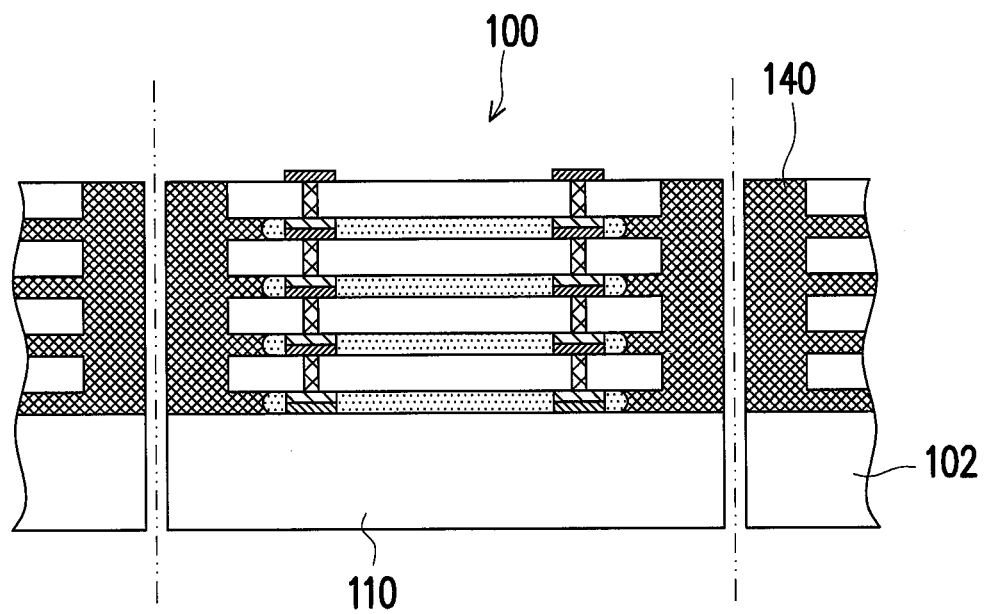

Next, referring to FIG. 5D, the encapsulant 140 and the wafer 102 are trimmed into a plurality of chip stack structures 100 as shown in FIG. 1A, wherein the wafer is separated into a plurality of first chips 110 isolated from one another.

After the above step, the chip stack structure 100 can be bonded to a carrier 310 to form a package structure as shown in FIG. 3, wherein the carrier 310 is for example an interposer serving as an adapting interface between the chip stack structure 100 and a printed circuit board 320. The second bumps 124 of the lowermost second chip 120 of the chip stack structure 100 are correspondingly bonded to the second contacts 312 of the carrier 310. In addition, an underfill 352 is provided into a space between the chip stack structure 100 and the carrier 310, to encapsulate the second bumps 124 of the lowermost second chip 120 and the second contacts 312 of the carrier 310. The carrier 310 is connected to the printed circuit board 320 through the third bumps 360, and an underfill 354 is provided into a space between the carrier 310 and the printed circuit board 320, to encapsulate the third bumps 360.

Figure 7:
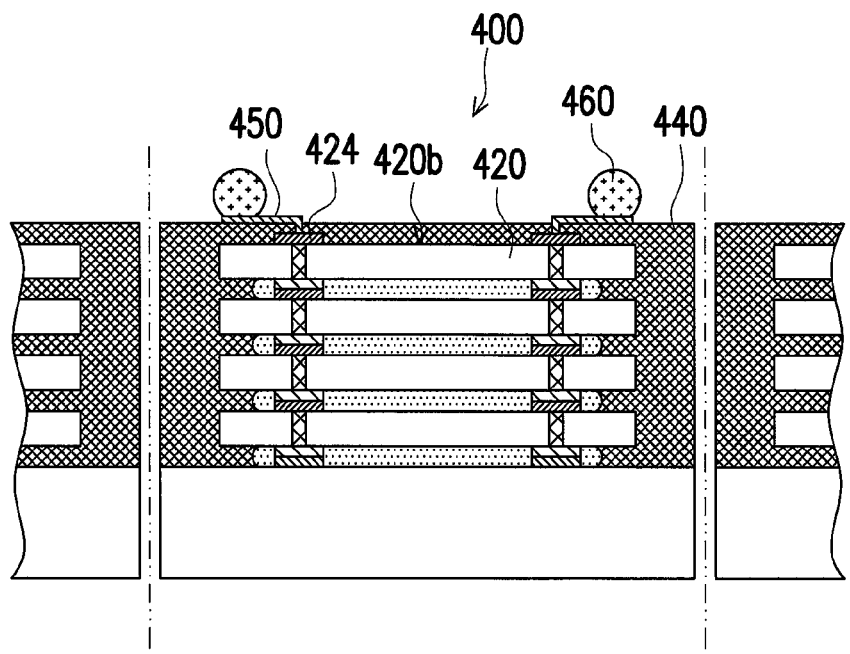
FIG. 7 shows a processing step of fabricating the chip stack structure as shown in FIG. 4.

FIG. 7 shows a processing step of fabricating the chip stack structure 400 as shown in FIG. 4. The chip stack structure 400 can be formed by adopting most steps of FIG. 5A through 5D, except that: in the step of forming the encapsulant 440, the encapsulant 440 is provided to further cover the third surface 420b of the uppermost second chip 420. That is, all of the second chips 420 are covered by the encapsulant 440. Then, an extending circuit 450 can be fabricated on the encapsulant 440, and the extending circuit 450 passes through the encapsulant 440 to connect the corresponding second bumps 424. Additionally, the third bumps 460 may be formed on the extending circuits 450.

Accordingly, after completing the aforementioned steps, the chip stack structure 400 is directly bonded to the circuit substrate 490 to form the package structure as shown in FIG. 4, wherein layout of the second bumps 424 is redistributed by the extending circuit 450, such that the third bumps 460 on the extending circuits 450 can be directly connected to the circuit substrate 490. The underfill 454 is provided into the space between the chip stack structure 400 and the circuit substrate to encapsulate the third bumps 460.

The disclosure provides a chip stack structure suitable for high density chip package with high processing yields, and capable of decreasing processing time, reducing manufacturing cost and performing wafer level molding.

In summary, the chip stack structure of the above embodiments takes a wafer as a stacking base and stacks chips thereon. By which, the chip stack structure is capable of achieving high density electrode bonding and breaking the bottleneck of requiring interposer to serve as a adapting interface in three dimensional chip package, to allow a high temperature bonding and achieve high processing yields. In addition, the chip stack structure is easily fabricated and compatible with wafer level process, so as to reduce processing time and manufacturing cost. Furthermore, the adhesive can be selectively formed with voiding a part of the space between two stacked chips, so as to give more tolerance and flexibility in selecting the material of the adhesive and considering match of coefficients of thermal expansion or strength of material. The particle size or concentration of the filler in the adhesive and the encapsulant can further be adjusted to achieve a superior stress buffering and protecting effect.

Although the invention has been described with reference to the above embodiments, it will be apparent to one of the ordinary skill in the art that modifications to the described embodiment may be made without departing from the spirit of the application. Accordingly, the scope of the application will be defined by the attached claims not by the above detailed descriptions.

What is claimed is:

1. A chip stack structure, comprising:
    a first chip, having a first surface and a plurality of first contacts on the first surface;
    at least one second chip, stacked on the first surface, wherein each of the at least one second chip has a second surface facing the first surface, a third surface opposite to the first chip, and a plurality of side surfaces connected between the second surface and the third surface, each of the at least one second chip comprising:
    a plurality of first bumps disposed on the second surface;
    a plurality of second bumps disposed on the third surface, wherein each of the first bumps is bonded to the corresponding first contact or the corresponding second bump of another second chip; and
    a plurality of first penetrating electrodes respectively connected between the first bumps and the second bumps;
    an adhesive disposed in a part of a space between any two adjacent chips of the first chip and the at least one second chip with voiding a remaining part of the space, wherein the adhesive is configured to cover each of the first bumps and the corresponding first contact or the corresponding second bump of the another second chip; and
    an encapsulant, disposed on the first surface to cover the adhesive and the plurality of side surfaces of each of the at least one second chip and expose the third surface of the uppermost second chip, wherein the remaining part of the space between the any two adjacent chips is filled with the encapsulant, the adhesive comprises a first filler, and the encapsulant comprises a second filler, a weight percentage of the first filler is smaller than a weight percentage of the second filler.

2. The chip stack structure of claim 1, wherein the adhesive comprises a first filler, the encapsulant comprises a second filler, and a particle size of the first filler is smaller than a particle size of the second filler.

3. The chip stack structure of claim 1, further comprising a carrier having a carrying surface and a plurality of second contacts on the carrying surface, wherein the first chip is arranged with the first surface facing the carrier, the at least one second chip is located between the first chip and the carrier, and the second bumps of the outermost second chip is bonded to the corresponding second contacts.

4. The chip stack structure of claim 3, further comprising an underfill disposed between the carrier and the outermost second chip.

5. The chip stack structure of claim 3, wherein the carrier comprises a plurality of second penetrating electrodes respectively connected to the corresponding second contacts.

6. The chip stack structure of claim 3, wherein the carrier comprises a circuit substrate or an interposer.

7. The chip stack structure of claim 1, wherein a material of the first bumps and the second bumps comprises an electroplating metal or an electroless plating metal.

8. The chip stack structure of claim 1, wherein each of the second chips further comprises a first insulating layer located between the second surface and the first bumps, and the first penetrating electrodes pass through the first insulating layer and are connected to the corresponding first bumps.

9. The chip stack structure of claim 1, wherein each of the second chips further comprises a second insulating layer located between the third surface and the second bumps, and the first penetrating electrodes pass through the second insulating layer and are connected to the corresponding second bumps.

10. The chip stack structure of claim 1, wherein a plurality of side surfaces of the encapsulant are aligned with the side surfaces of the first chip.

11. The chip stack structure of claim 1, wherein a thickness of the first chip is greater than 100 μm.

12. The chip stack structure of claim 1, wherein a size of the first chip is greater than a size of the second chip.

13. The chip stack structure of claim 1, further comprising an extending circuit, wherein the extending circuit is disposed on the encapsulant and passes through the encapsulant to connect the corresponding second bumps.

14. The chip stack structure of claim 13, further comprising a plurality of third bumps disposed on encapsulant and connected to the extending circuit.

15. The chip stack structure of claim 1, wherein each of the first bumps forms a bonding structure with the corresponding first contact or the corresponding second bump, a center region of the space surrounded by the bonding structures is fully filled with the adhesive, and a peripheral region of the space outside the bonding structures is partially filled with the adhesive.

16. The chip stack structure of claim 1, wherein each of the first bumps forms a bonding structure with the corresponding first contact or the corresponding second bump, a center region of the space surrounded by the bonding structures is partially filled with the adhesive, and a peripheral region of the space outside the bonding structures is partially filled with the adhesive.

* * * * *